(12) United States Patent
Okuyama et al.

(10) Patent No.: US 10,102,180 B2
(45) Date of Patent: Oct. 16, 2018

(54) MAJORITY CIRCUIT

(71) Applicant: HITACHI, LTD., Tokyo (JP)

(72) Inventors: Takuya Okuyama, Tokyo (JP);
Masanao Yamaoka, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/758,097

(22) PCT Filed: Nov. 25, 2015

(86) PCT No.: PCT/JP2015/083060
§ 371 (c)(1),
(2) Date: Mar. 7, 2018

(87) PCT Pub. No.: WO2017/090122
PCT Pub. Date: Jun. 1, 2017

(65) Prior Publication Data
US 2018/0246849 A1    Aug. 30, 2018

(51) Int. Cl.
*H03K 19/23* (2006.01)
*G06F 17/10* (2006.01)
*G06F 7/38* (2006.01)

(52) U.S. Cl.
CPC .............. *G06F 17/10* (2013.01); *G06F 7/38* (2013.01); *H03K 19/23* (2013.01)

(58) Field of Classification Search
CPC ............ G06F 17/10; G06F 7/38; H03K 19/23
USPC ........................................................ 326/35
See application file for complete search history.

(56) References Cited

U.S. PATENT DOCUMENTS

| | | | |
|---|---|---|---|
| 5,053,645 A | 10/1991 | Harada | |
| 7,688,102 B2* | 3/2010 | Bae | H03K 19/23 326/11 |
| 8,476,924 B2* | 7/2013 | Choi | H03K 19/0813 326/36 |
| 2014/0062529 A1* | 3/2014 | Ramachandra | G06F 7/501 326/35 |

FOREIGN PATENT DOCUMENTS

| | | |
|---|---|---|
| JP | 2-276310 A | 11/1990 |
| JP | 4-199356 A | 7/1992 |
| JP | 2006-025345 A | 1/2006 |

OTHER PUBLICATIONS

Yamaoka et al., 20k-spin Ising Chip for Combinational Optimization Problem with CMOS Annealing, ISSCC 2015 / Session 24 / Secure, Efficent Circuits for IoT / 24.3, pp. 432-433 for Digest of Technical Papers page and 978-1-4799-6224-2/15 for 2015 IEEE International Solid-State Circuits Conference, 2015.
International Search Report for WO 2017/090122 A1, dated Jan. 12, 2016.

* cited by examiner

*Primary Examiner* — Daniel D Chang
(74) *Attorney, Agent, or Firm* — Volpe and Koenig, P.C.

(57) ABSTRACT

An object of the invention is to provide a majority circuit which may be manufactured cheaply and easily and may process necessary majority functions for calculation in an interaction model. The majority circuit according to the invention simplifies the processing of the majority function by using a bitonic sort circuit to round the sum of input signals to a power of 2.

10 Claims, 7 Drawing Sheets

MAJORITY CIRCUIT

TECHNICAL FIELD

The present invention relates to a majority circuit that takes majority votes of an input signal.

BACKGROUND ART

Various physical phenomena and social phenomena may be represented by an interaction model. The interaction model is a model defined by a plurality of nodes constituting a model, interactions between the nodes, and, if necessary, bias for each node. Various models have been proposed in physics and social science, but all may be interpreted as one form of an interaction model.

Many of these interaction models contain majority functions for operations within the model. NPL 1 below proposes an algorithm and a circuit for executing the operation of a majority function.

CITATION LIST

Non-Patent Literature

NPL 1: "20k-spin Ising chip for combinational optimization problem with CMOS annealing", ISSCC Dig. Tech. Papers (2015).

SUMMARY OF INVENTION

Technical Problem

The majority circuit may be mounted, for example, by an adder circuit and a comparator. However, as an input value range and the number given to the majority function increase, the mounting area of the adder circuit increases, and scalability and energy efficiency decrease.

In NPL 1, a majority function using an analog circuit is realized in order to realize a majority vote operation without using an adder circuit. This circuit detects the voltage difference between the two systems in the circuit and realizes a majority vote operation.

It is ideal that transistors forming the majority circuit all have equal characteristics. In fact, however, there are inherent variations for each element. The variation in the current increases as a transistor size W/L decreases. Therefore, it is necessary to consider variations so that the result of majority vote does not invert. In this manner, it was difficult to mount the majority circuit with a circuit with a small area without using an adder circuit in a case where the input value range or the number given to the majority function is increased.

In view of the above problems, an object of the invention is to provide a majority circuit which may be manufactured cheaply and easily and may process necessary majority functions for calculation in an interaction model.

Solution to Problem

The majority circuit according to the invention simplifies the processing of the majority function by using a bitonic sort circuit to round the sum of input signals to a power of 2.

Advantageous Effects of Invention

The majority circuit according to the invention may process the majority function with a small mounting area even in a case where the input value range and the number are large. The above and other objects and novel features of the invention will become apparent from the description of this specification and the accompanying drawings.

DESCRIPTION OF EMBODIMENTS

Embodiment 1: I/O of Majority Circuit

Figure 1:
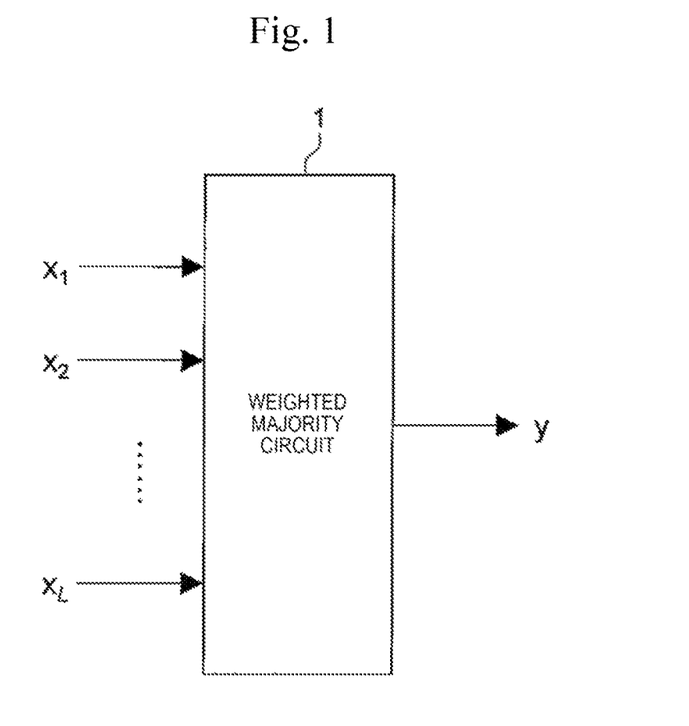
FIG. 1 is a diagram for explaining input and output of a majority circuit 1 according to Embodiment 1.

FIG. 1 is a diagram for explaining input and output of the majority circuit 1 according to Embodiment 1 of the invention. The majority circuit 1 receives signals to which high or low voltages are applied as input signals. Weights are respectively defined for these input signals. The majority circuit 1 outputs a signal representing the result of majority voting considering the voltage and weight of each input signal. The specific operation will be described below.

The majority circuit 1 receives a signal $x_k$ ($1 \leq k \leq L$) of a weight $w_k$ (integer). The voltage of the signal is high or low, and a function f(x) giving a value according to the voltage is defined. f(x) returns f(x)=+1 if the signal x is high and returns f(x)=−1 if the signal x is low.

A value S defined by the following equation 1 is introduced. If S≥0, the majority circuit 1 outputs high as a signal y representing the result of majority voting and outputs low if S<0.

[Equation 1]

$$S = \sum_k w_k f(x_k) \qquad (1)$$

For example, when L=4, $(x_1, w_1)$=(high, 1), $(x_2, w_2)$=(low, −2), $(x_3, w_3)$=(low, 3), $(x_4, w_4)$=(high, 4), S=+4. Therefore, the majority circuit 1 outputs high.

In accordance with the weight $w_k$, the signal $w_k[i]$ ($0 \leq i \leq D$) is defined as follows. For simplicity of description, the weight is assumed to be an odd number. In a case where $w_k>0$, $w_k[i]$ ($0 \leq i < D$) is high if the (i+1)th value is 1 from the low order bit when $(w_k-1)/2$ is represented in binary notation if the (i+1)th value is 0, $w_k[i]$ ($0 \leq i < D$) is low. In addition, $w_k[D]$=high is set. For example, when $w_k$=5 and D=2, $w_k[2]$=high. In addition, $w_k[0]$=low and $w_k[1]$=high because binary representation of $(w_k-1)/2=2$ results in $(2)_{10}=(10)_2$.

From the above definition, the following Equation 2 holds.

[Equation 2]

$$\frac{w_k - 1}{2} = \sum_{0 \le i < D} 2^i \frac{f(w_k[i]) + 1}{2} \quad (2)$$

Equation 2 gives Equation 3 below.

[Equation 3]

$$w_k = \sum_{0 \le i \le D} 2^i f(w_k[i]) \quad (3)$$

In the case of $w_k<0$, the signal $w_k[i](0 \le i \le D)$ is defined as the inversion of each bit in the case of $(-w_k)>0$. For example, when $w_k=-5$ and D=2, $w_k[0]$=high and $w_k[1]=w_k[2]$=low. Even in the case of $w_k<0$, Equation 3 clearly holds.

Figure 2A:
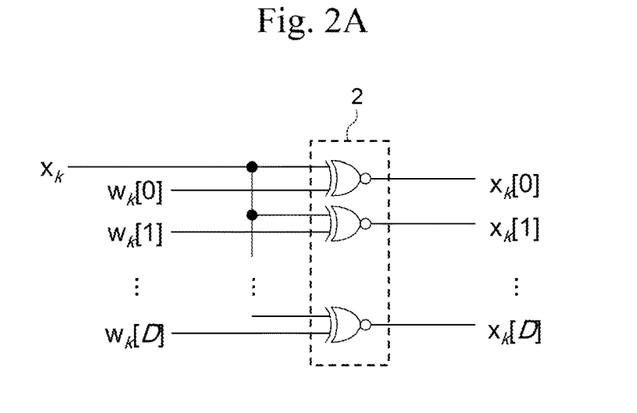
FIG. 2A is a configuration diagram of a circuit that calculates a weighted input.

FIG. 2A is a configuration diagram of the circuit that calculates the weighted input. An XNOR (exclusive OR negation) circuit 2 receives signals $x_k$ and $w_k[i](0 \le i \le D)$ and outputs $x_k[i]$. The weight of signal $x_k[i]$ is defined as $2^i$. When $x_k$=high, $f(x_k)=1$ and $f(x_k[i])=f(w_k[i])$, and the following Equation 4 holds together with Equation 3. On the other hand, when $x_k$=low, $f(x_k)=-1$ and $f(x_k[i])=-f(w_k[i])$, and Equation 4 holds together with Equation 3. That is, Equation 4 always holds.

[Equation 4]

$$w_k f(x_k) = \sum_{0 \le i \le D} 2^i f(x_k[i]) \quad (4)$$

Figure 2B:
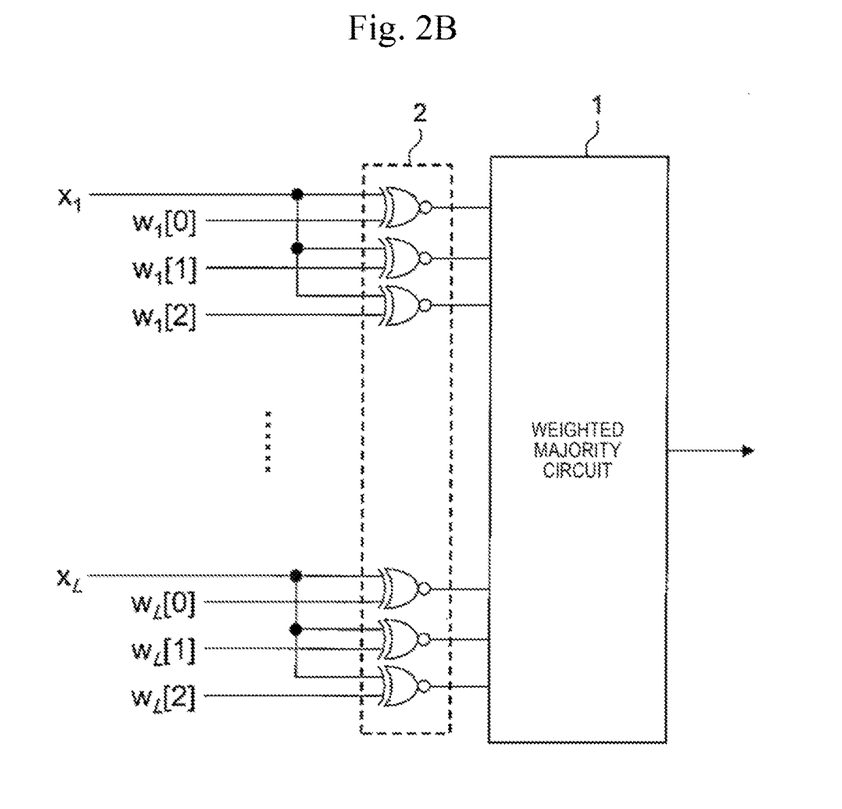
FIG. 2B is a diagram showing a configuration for inputting a weighted signal to the majority circuit 1.

FIG. 2B is a diagram showing a configuration for inputting a weighted signal to the majority circuit 1. The case where the weight is an odd number is described, but in a case where the weight is an even number, the weight may be treated as the sum of two odd numbers. For example, inputting the signal with the weight $w_k=4$ to the majority circuit is regarded as inputting a signal having weights $w_k+=3$ and $w_k-=1$ to the majority circuit. Therefore, in a case where the weight is an integer, according to Equation 4, the weight of the input signal may be limited to the power of 2. Hereinafter, the input signal of the majority circuit 1 is $x_k[i](1 \le k \le L, 0 \le i \le D)$, and L is an even number.

Embodiment 1: Configuration of Rearrangement Circuit Constituting Majority Circuit 1

The majority circuit 1 processes the majority function by using the rearrangement circuit described below. The rearrangement circuit is a circuit that receives a plurality of signals and rearranges the signals in accordance with the signal value of each signal. The input signal of the rearrangement circuit is denoted as $x_k$.

Figure 3:
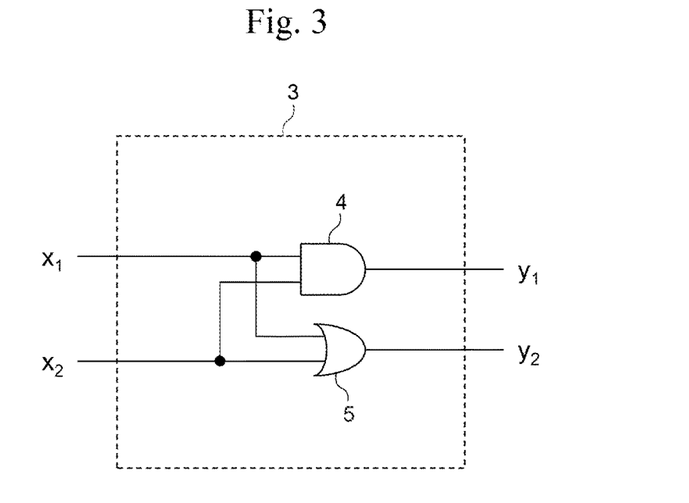
FIG. 3 is a diagram showing an example of a rearrangement circuit 3.

FIG. 3 is a diagram showing an example of the rearrangement circuit 3. The rearrangement circuit 3 receives two signals $x_1$ and $x_2$, rearranges the signals according to the voltage of each signal line, and outputs signals $y_1$ and $y_2$ representing the result of the rearrangement. Hereinafter, the rearrangement circuit is rearranged so that the values are in ascending order. For example, a circuit for rearranging two signals is realized by using one AND gate 4 and one OR gate 5 as shown in FIG. 3.

Figure 4:
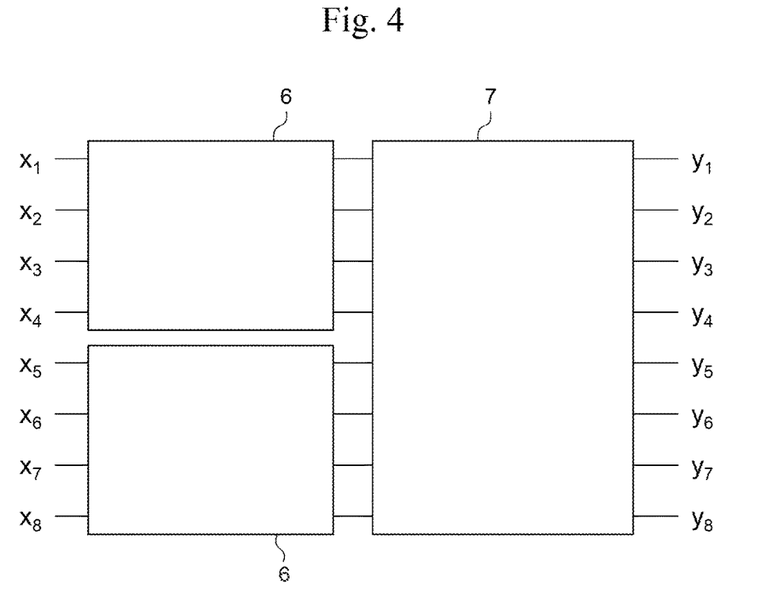
FIG. 4 is a configuration example of the circuit for rearranging eight signals $x_k$ ($1 \leq k \leq 8$) based on bitonic sorting.

FIG. 4 is a configuration example of the circuit for rearranging eight signals $x_k$ ($1 \le k \le 8$) based on bitonic sorting. Bitonic sorting is known as an algorithm for rearranging a larger number of signals. The circuit 6 is a circuit for receiving and rearranging four signals. The circuit 7 receives two sets of four signals rearranged in ascending order, rearranges, and outputs a total of eight signals.

Hereinafter, a circuit that receives N signals and outputs rearranged N signals is called an N sort circuit. In addition, a circuit that receives and rearranges two sets of N/2 rearranged signals is called an N merge circuit. The circuit 6 is a 4 sort circuit, and the circuit 7 is an 8 merge circuit.

As shown in FIG. 4, the 8 sort circuit is constituted by two 4 sort circuits and one 8 merge circuit. In this manner, the N sort circuit which rearranges by bitonic sorting may be constituted by placing one N merge circuit behind two (N/2) sort circuits arranged in parallel.

Figure 5:
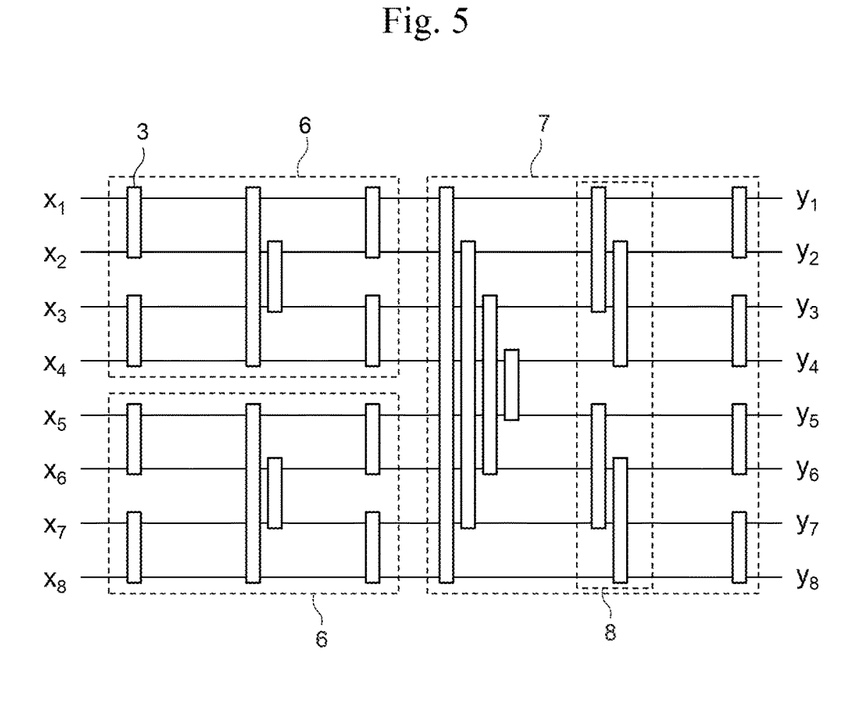
FIG. 5 is a configuration example of an 8 sort circuit.

FIG. 5 is a configuration example of the 8 sort circuit. By using the circuit 3 (2 sort circuit) shown in FIG. 3, the 8 sort circuit may be constituted as shown in FIG. 5. The circuit 3 included in area 8 may operate in parallel. Therefore, when processing time of the circuit 1 is expressed as one stage, the processing time of the 4 sort circuit is 3 stages and the processing time of the 4 merge circuit is 3 stages. In general, the N merge circuit requires log(N), and the N sort circuit requires $\log_2(N)(\log_2(N)+1)/2$.

Embodiment 1: Principle of Operation of Majority Circuit 1

The majority circuit 1 makes it possible to process the majority function using a bitonic sort circuit by rounding the sum S of the weighted signals to a power of 2. Specifically, the sort circuit is configured so that the weighted sum lost in the process of rearranging the weighted input signals by the bitonic sort circuit falls within a certain range. The principle of operation for that purpose will be described below.

With respect to the sum of the input signal $x_k$ of the N sort circuit and $y_k(1 \le k \le N)$ of the output signal, the following Equation 5 holds.

[Equation 5]

$$\sum_{1 \le k \le N} f(x_k) = \sum_{1 \le k \le N} f(y_k) \quad (5)$$

The magnitude relation of $f(y_k)+f(y_{k+1})$ and $2y_k$ are compared. $f(y_k)+f(y_{k+1})=2y_k$ holds when $\{f(y_k), f(y_{k+1})\}=\{-1, -1\}$, $\{+1, +1\}$. $f(y_k)+f(y_{k+1})-2=2f(y_k)$ when $\{f(y_k), f(y_{k+1})\}=\{-1, +1\}$. Since $f(y_k) \le f(y_{k+1})$, $\{f(y_k), f(y_{k+1})\}=\{+1, -1\}$ may not exist. In addition, in a case where the sort circuit rearranges the input signals in ascending order, there is only 0 or 1 place where the value of the output signal switches from $-1$ to $+1$. Therefore, the natural number k of $\{f(y_k), f(y_{k+1})\}=\{-1, +1\}$ is one at most. Based on the above, the following principles hold.

(Principle 1)

When all $\{f(y_k), f(y_{k+1})\}$ pairs are either $\{-1, -1\}$ or $\{+1, +1\}$, for example, when only the odd-numbered output signals are taken out and the sum is doubled, the sum of the odd-numbered output signals becomes equal to the sum of the entire output signals. In a case where {−1, +1} is included in one of {f($y_k$), f($y_{k+1}$)} pairs, the sum of the odd-numbered signals is smaller. Therefore, the sum of the odd-numbered signals does not exceed the sum of the entire output signals. In the case of taking out even-numbered signals as well, the same way may be considered, but for simplicity of description, it is assumed that odd-numbered signals are taken out in Embodiment 1.

(Principle 2)

There is only one set that may be {−1, +1} in {f($y_k$), f($y_{k+1}$)} pairs. Therefore, even if the sum of the odd-numbered signals is smaller than the sum of the entire output signals, the difference between them is only −2, which is caused by the one set.

According to Principle 1 and Principle 2, the following Equation 6 holds. Principle 1 corresponds to the right half of Equation 6, and Principle 2 corresponds to the left half of Equation 6. Although weights are not considered here, the relationship when a weight is w will be described later.

[Equation 6]

$$\sum_{1 \le k \le N} f(y_k) - 2 \le 2 \sum_{k=1,3,5,\ldots} f(y_k) \le \sum_{1 \le k \le N} f(y_k) \quad (6)$$

From Equations 5 and 6, Equation 7 below is obtained.

[Equation 7]

$$\sum_{1 \le k \le N} f(x_k) - 2 \le 2 \sum_{k=1,3,5,\ldots} f(y_k) \le \sum_{1 \le k \le N} f(x_k) \quad (7)$$

Further, the weight w is considered. w is set to all the weights of the signals received by the N sort circuit. At this time, a sum U of the weights of the input signals is expressed by the following Equation (8).

[Equation 8]

$$U = w \sum_{1 \le k \le N} f(x_k) \quad (8)$$

In the signal output by the N sort circuit, only the odd number ($y_1$, $y_3$, . . . ) is taken out and the sum thereof is doubled. Since the weight w is common, an odd-numbered sum V is obtained by the following Equation 9. Equation 9 is equivalent to extracting only an odd-numbered output signal and adding the weight after increasing the weight to twice (that is, 2w).

[Equation 9]

$$V = 2w \sum_{k=1,3,5,\ldots} f(y_k) \quad (9)$$

U−2w≤V≤U is obtained from Equations 7, 8, and 9. That is, in a case where the signals of the weight w are rearranged in ascending order and only the odd-numbered signals are taken out and the sum thereof is doubled, even if twice the sum of the odd-numbered signals does not increase more than the sum of the output signals, and twice the sum of the odd-numbered signals is less than the sum of the output signals, the difference between them is only 2w.

The majority circuit 1 rounds up the sum of the input signals to the power of 2 using the above principle. In order to realize this, two sets of N/2 rearranged signals are received and rearranged in ascending order, and a circuit for extracting only the odd-numbered signals is provided. Hereinafter, this circuit is called an N merge/selection circuit.

Figure 6:
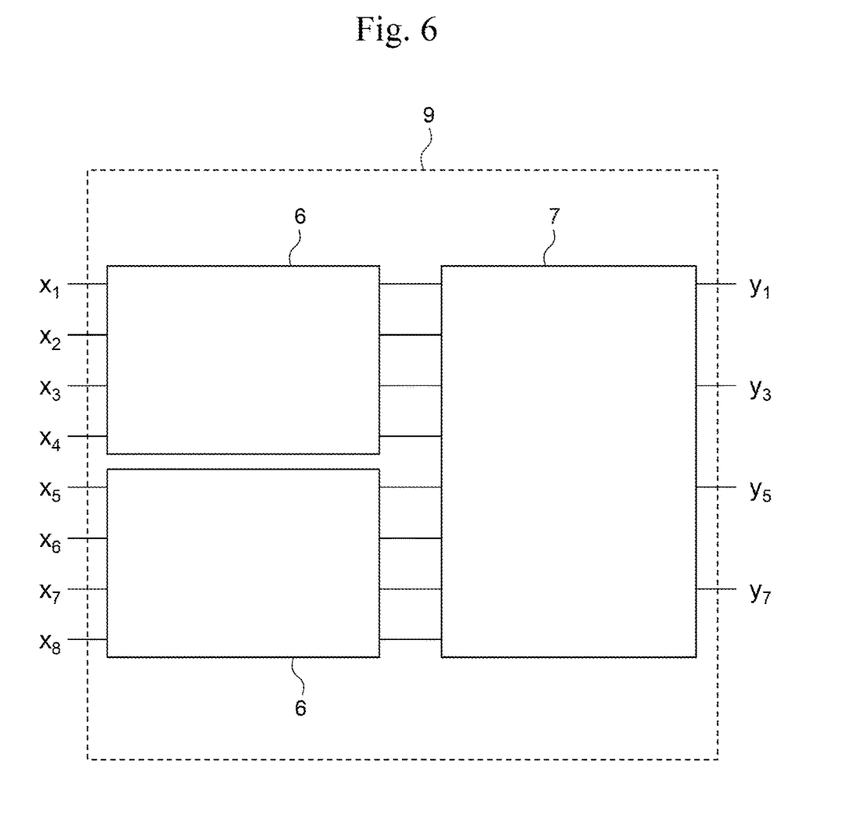
FIG. 6 is a diagram showing a configuration example of a circuit 9 in which a 4 sort circuit 6 and an 8 merge circuit 7 are combined.

FIG. 6 is a diagram showing a configuration example of a circuit 9 in which a 4 sort circuit 6 and an 8 merge circuit 7 are combined. In a case where it is assumed that the weight of the input signal $x_k$ (1≤k≤8) of the circuit 8 is w and the weight of the output signal $y_k$ (k=1, 3, 5, and 7) is 2w, the sum of the odd-numbered signals is equal to or less than the sum of the entire output signals and the difference between them is at most 2w.

Embodiment 1: Arithmetic Procedure of Majority Circuit 1

Figure 7:
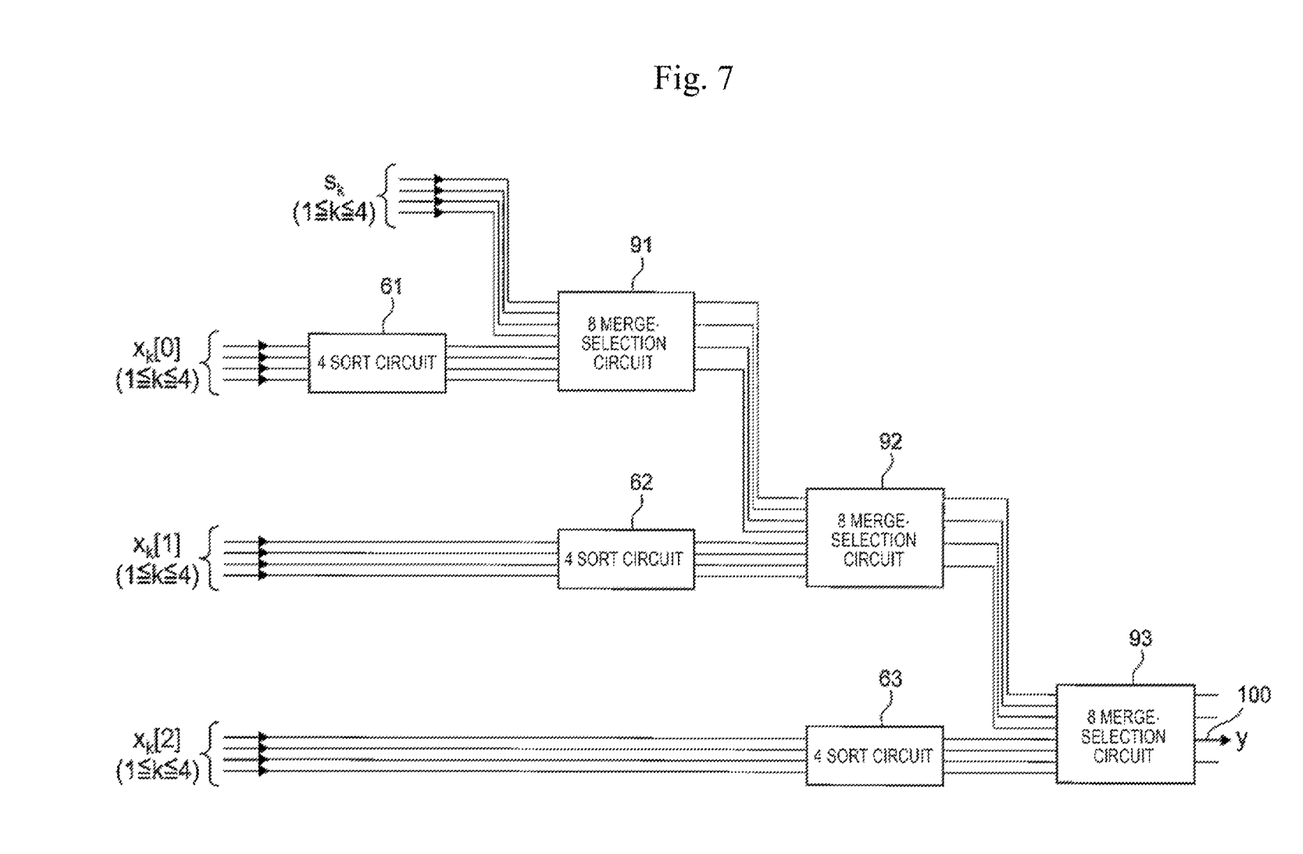
FIG. 7 is a configuration example of the majority circuit 1 in the case of (D, L)=(2, 4).

FIG. 7 shows a configuration example of the majority circuit 1 in the case of (D, L)=(2, 4). The signal $s_k$ (1≤k≤4) is given as an input to the first merge/selection circuit for convenience and is set so as not to change the sum of the original input signals. For example, $s_1$=$s_2$=low, $s_3$=$s_4$=high are set, and the weight is set to 1.

The weight of the signal $x_k$[0] (1≤k≤4) is 1. A 4 sort circuit 61 which receives this signal outputs four signals of a weight 1. The 8 merge/selection circuit 91 receives two sets of four signals of the weight 1 rearranged in ascending order and outputs four signals of a weight 2. The sum of the signals lost by the operation of the circuit 91 is at most 2.

The weight of the signal $x_k$[1] is 2. The 4 sort circuit 62 receives the signal $x_k$[1], rearranges the signals in ascending order, and outputs four signals of the weight 2. The 8 merge/selection circuit 92 receives four signals of the weight 2 arranged in ascending order output from the 8 merge/selection circuit 91 and four signals of the weight 2 arranged in ascending order output by the 4 sort circuit 62 and outputs four signals of a weight 4. The sum of the signals lost by the operation of the circuit 92 is at most 4. The same applies to the following description.

In the circuit configuration shown in FIG. 7, the sum of signals is lost in only the 8 merge/selection circuit. The sum of signals lost by each of the 8 merge/selection circuits 91 to 93 is at most 2+4+8=14.

The 8 merge/selection circuit 93 outputs a signal with a weight of 8, and the number thereof is an even number. Therefore, the sum T of the output signals of the 8 merge/selection circuit 93 is always a multiple of 16.

When it is assumed that the sum of the input signal $x_k$[i] (1≤k≤4, 0≤i≤2) is S, the following Equation 10 holds.

[Equation 10]

$$S-14 \le T \le S \quad (10)$$

The following Equation 11 is defined as a function representing a sign.

[Equation 11]

$$\text{sgn}_+(x) = \begin{cases} +1 & (x \ge 0) \\ -1 & (x < 0) \end{cases} \quad (11)$$

When S≥0, T is −14 or more and a multiple of 16. Therefore, T≥0 holds, and $\text{sgn}_+$(S)=$\text{sgn}_+$(T) holds. Since T<0 when S<0, also in this case, $sgn_+(S)=sgn_+(T)$ is satisfied. From the above, since $sgn_+(S)=sgn_+(T)$ always holds, the sign of the sum S of the input signals and the sign of the sum T of the output signals of the 8 merge/selection circuit 93 are necessarily coincident. That is, the result of majority voting may be determined only by $sgn_+(T)$ representing the sign of T.

The output signals of the 8 merge/selection circuit 93 are rearranged in ascending order. Therefore, in the case of T≥0, the third out of the four output signals of the 8 merge/selection circuit 93 is always high. Similarly, in the case of T<0, the third signal is always low. Therefore, when the third output signal from the 8 merge/selection circuit 93 is y, $sgn_+(T)=f(y)$. That is, the majority circuit 1 extracts the third signal of the 8 merge/selection circuit 93 as the result of the majority voting of the input signals. For example, it is possible to provide a terminal 100 for taking out the signal.

Embodiment 1: Summary

According to the majority circuit 1 of Embodiment 1, it is possible to manufacture a majority circuit cheaply and easily and to execute operation of a majority function required by calculation of an arbitrary interaction model such as Ising model.

In the majority circuit 1 according to Embodiment 1, the input signal $x_k$ is rearranged by the 4 sort circuit and only the odd-numbered signals are extracted by the 8 merge/selection circuit. As a result, it is possible to obtain majority voting of the input signals in the final stage without greatly damaging the sum of the input signals. Therefore, it is possible to obtain majority voting of many input signals with a relatively small mounting area without using an adder circuit.

Embodiment 2

The circuit configuration of (D, L)=(2, 4) is shown in FIG. 7 of Embodiment 1. Even if L increases or decreases, it is obvious that the majority function may be processed with the same circuit configuration. Likewise, the circuit configuration similar to that in FIG. 7 is established for a general natural number D. Hereinafter, this will be described with a concrete equation.

D is an arbitrary natural number. The weights of the input signals of the majority circuit 1 are $1, 2, 4, \ldots, 2^D$, and the sum of the weights of the input signals is denoted by S'. The merge/selection circuit appears (D+1) times in the majority circuit 1, and the maximum W' of the sum of the signals lost by these merge/selection circuits is obtained by the following Equation 12.

[Equation 12]

$$W' = \sum_{i=0}^{D} 2^{i+1} = 2(2^{D+1} - 1) \tag{12}$$

The weight sum T' of the output signals of the merge/selection circuit appearing at the end of the calculation flow satisfies the following Equation 13.

[Equation 13]

$$S'-W' \leq T' \leq S' \tag{13}$$

The merge/selection circuit appearing at the end of the calculation flow outputs a signal of weight $2^{D+1}$, and this number is an even number. Therefore, the weight sum T' is a multiple of $2^{D+2}$. In addition, from Equation 10, $W'<2^{D+2}$ holds. Therefore, the following Equation 14 holds.

[Equation 14]

$$S'-2^{D+2} < T' \leq S' \tag{14}$$

That is, the weight sum T' satisfies Equation 13 and is a multiple of $2^{D+2}$. An integer T satisfying this condition is uniquely determined. Then, based on the same discussion as above, it is shown that $sgn_+(S')=sgn_+(T')$ holds.

Therefore, in general D and L, by extending the calculation flow of FIG. 7, the circuit functions as a majority circuit. At this time, it is necessary to change the configuration of the majority circuit according to the values of D and L. For example, in the case of L=8, the majority voting is determined at the fifth signal out of the eight signals output from the merge/selection circuit (that is, the first in the latter half of respective output signals).

Embodiment 3

Figure 8:
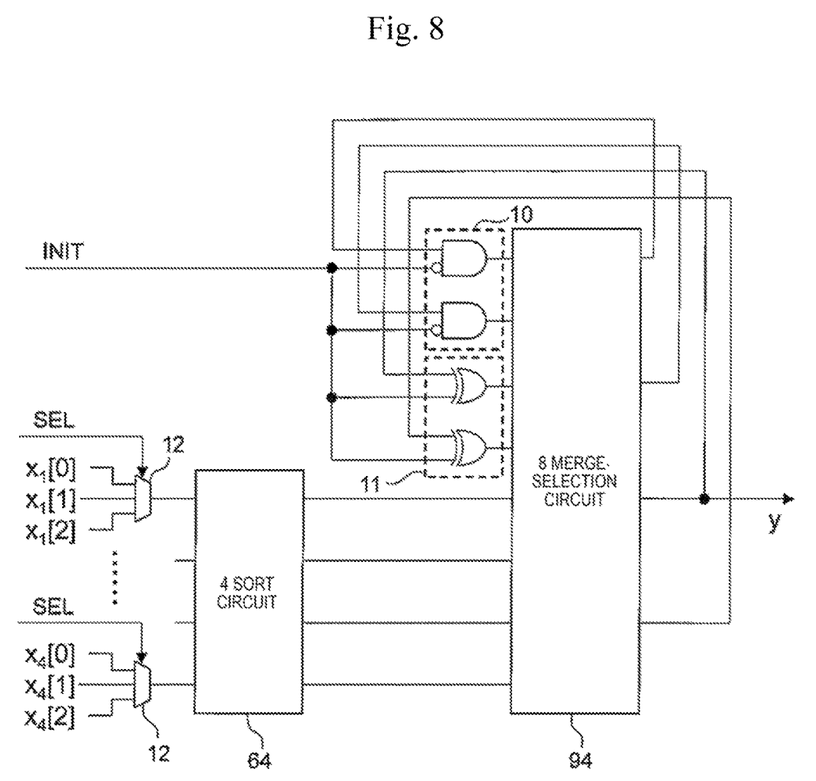
FIG. 8 is a circuit diagram of a majority circuit according to Embodiment 3.

FIG. 8 is a circuit diagram of a majority circuit according to Embodiment 3 of the invention. Since the same circuit configuration is used repeatedly in FIG. 7, the mounting area may be suppressed by reusing the same circuit for the repeated portion. Therefore, in Embodiment 3, as shown in FIG. 8, the 4 sort circuit 64 is used repeatedly and the output of the 8 merge/selection circuit 94 is returned to the input side, thereby forming a recursive circuit configuration. The operation of the circuit shown in FIG. 8 will be described below.

When a signal line INIT is high, an AND gate 10 outputs low and an OR gate 11 always outputs high. On the other hand, when the signal line INIT is low, both of the AND gate 10 and the OR gate 11 output signals that are not the signal line INIT out of the two signals received as they are.

A plurality of multiplexers 12 select a total of L signals from the signal $x_k[i]$ (1≤k≤L, 0≤i≤D) input to the majority circuit 1 according to a signal line SEL.

First, the multiplexer 12 selects $x_k[0]$ which is a signal of the weight 1. Then, 4 sort circuit 64 outputs four signals of the weight 1 rearranged in ascending order. At the same time, by adjusting the timing at which the signal line INIT is set to high, the AND gate 10 outputs low and the OR gate 11 outputs high, and the 8 merge/selection circuit 94 may receive two sets of four rearranged signals. This is the same operation as that of the circuit 91 in the calculation flow shown in FIG. 7.

When receiving eight signals of the weight 1, the circuit 94 outputs four signals of weight 2. When the signal line INIT is set to low, the four signals output from the circuit 94 are again applied to the input of the circuit 94. It is clear that the outputs of the circuit 94 are arranged in ascending order.

The circuit 94 controls the signal line SEL and gives a signal $x_k[1]$ of weight 2 to the circuit 64 while executing a logical operation. As a result, the four signals of the weight 2 output from the gates 10 and 11 and the four signals of the weight 2 output from the circuit 64 are input to the circuit 94 at the same time.

Hereinafter, by controlling the signal lines INIT and SEL in the same manner, the same calculation as in FIG. 7 may be performed by the circuit of FIG. 8. By obtaining the third out of the four signals output by the circuit 94, the result of majority voting is obtained.

Modification Example of Invention

In the above embodiment, for the sake of convenience, if necessary, the description has been divided into a plurality of sections or embodiments, but unless otherwise specified, the sections or embodiments are not unrelated to each other, and one is in a relationship of a part or the whole of the other such as a modification example, details, supplementary explanation, and the like. In addition, in the above embodiment, in the case of referring to the number of elements or the like, the number is not limited to a specific number and may be a specific number or more or less except in particular cases and cases where it is obviously limited to a specific number in principle.

In the above embodiment, it goes without saying that the constituent elements (including the element steps and the like) are not necessarily indispensable except in a case where it is explicitly stated and a case where it is considered to be obviously indispensable in principle. Similarly, in the above embodiment, when referring to the shape, positional relationship, and the like of the constituent elements and the like, except for the case where it is expressly stated, the case where it is considered to be obviously not the case in principle, and the like, it is intended to include substances which are substantially similar or similar to the shape or the like. This also applies to the above numerical values and ranges.

The above embodiments have been described in detail in order to describe the invention in an easy-to-understand manner and are not necessarily limited to those having all the configurations described. In addition, a part of the configuration of one embodiment may be replaced by the configuration of another embodiment, and the configuration of another embodiment may be added to the configuration of one embodiment. In addition, it is possible to add, delete, and replace other configurations with respect to a part of the configuration of each embodiment. For example, the AND gate 10 and the OR gate 11 in the above embodiment may be replaced by a multiplexer.

In the above embodiment, it is assumed that the rearrangement circuit rearranges the input signals in ascending order, and the merge/selection circuit extracts odd numbers. The input signals may be rearranged in descending order instead of ascending order. In this case, the sum of the weights of the signals is increased by the merge/selection circuit. Therefore, sgn_(S)=sgn_(T) holds with respect to the weight sum S of the signals input to the majority circuit and the weight sum T of the signals output by the last merge/selection circuit. Here, sgn_(x) is a function defined by the following Equation 15.

[Equation 15]

$$\text{sgn\_}(x) = \begin{cases} +1 & (x > 0) \\ -1 & (x \leq 0) \end{cases} \quad (15)$$

At this time, the output signal of the merge/selection circuit used for determination of majority voting is different from the above embodiment. For example, in the case of L=4, out of the four signals to be output by the merge/selection circuit, the second signal $y_2$ (that is, the last part of the first half of respective output signals) is used. This is because sgn_(T)=f($y_2$) holds.

The merge/selection circuit may extract even numbers instead of odd numbers. When the rearrangement circuit rearranges in ascending order and the merge/selection circuit extracts the even-numbered signals, the signal weight sum increases. The rest is the same as above.

It is conceivable that the rearrangement circuit rearranges in descending order and the merge/selection circuit extracts even-numbered signals. In this case, since the sum of weights of the signals decreases, the configuration of the majority circuit is the same as that of Embodiment 1.

REFERENCE SIGNS LIST

1 majority circuit
2 XNOR circuit
3 rearrangement circuit
61 to 64 4 sort circuit
91 to 94 8 merge/selection circuit

The invention claimed is:

1. A majority circuit that takes majority voting of a plurality of input signals having either one of two values, the circuit comprising:
   a first sort circuit that receives a plurality of first input signals as the input signals, and rearranges to output the first input signals in descending order or ascending order of values of the first input signals;
   a first selection circuit that receives twice as many signals as the number of the first input signals, rearranges the signals in the same order as rearrangement by the first sort circuit, and selects all even-numbered or odd-numbered signals out of the rearranged signals to output the selected signals; and
   a terminal that outputs the last signal of the first half or the first signal of the latter half of the respective outputs of the first selection circuit as a result of the majority voting.

2. The majority circuit according to the claim 1, further comprising:
   a signal supply circuit that receives the same number of signals as the first input signal as an input to the first selection circuit,
   wherein the first sort circuit is configured to receive and rearrange the first input signal having a first weight,
   the first selection circuit is configured to output a signal having a weight twice the first weight, and
   the signal supply circuit is configured to provide a signal having the first weight to the first selection circuit.

3. The majority circuit according to the claim 2, further comprising:
   a second sort circuit that receives the same number of second input signals having a second weight of half the first weight as that of the first input signal as the input signals, and rearranges to output the second signals in the same order as the rearrangement by the first sort circuit,
   wherein the signal supply circuit is configured as a second selection circuit that receives twice as many signals as the number of the second input signals, rearranges the signals in the same order as the rearrangement by the second sort circuit, and selects all even-numbered or all odd-numbered signals out of the rearranged signals to output the selected signals, and
   the majority circuit, further comprises
   a second signal supply circuit that provides the same number of signals as that of the second input signals having the second weight to the second selection circuit.

4. The majority circuit according to the claim 1,
   wherein the first input signals have a positive or negative value having the same absolute value, the first sort circuit rearranges to output the first input signals in ascending order of the values of the first input signals, the first selection circuit receives twice as many signals as the number of the first input signals, rearranges the signals in ascending order, and selects all odd-numbered signals out of the rearranged signals to output the selected signals, and the terminal outputs the first signal of the latter half of the respective outputs of the first selection circuit as a result of the majority voting.

5. The majority circuit according to the claim 1, wherein the first input signals have a positive or negative value having the same absolute value, the first sort circuit rearranges to output the respective first input signals in ascending order of the values of the first input signals, the first selection circuit receives twice as many signals as the number of the first input signals, rearranges the signals in ascending order, and selects all even-numbered signals out of the rearranged signals to output the selected signals, and the terminal outputs the last signal of the first half of the respective outputs of the first selection circuit as a result of the majority voting.

6. The majority circuit according to the claim 1, wherein the first input signals have a positive or negative value having the same absolute value, the first sort circuit rearranges to output the respective first input signals in descending order of the values of the first input signals, the first selection circuit receives twice as many signals as the first input signals, rearranges the signals in descending order, and selects all odd-numbered signals out of the rearranged signals to output the selected signals, and the terminal outputs the last signal of the first half of the respective outputs of the first selection circuit as a result of the majority voting.

7. The majority circuit according to the claim 1, wherein the first sort circuit rearranges to output the respective first input signals in descending order of a value of the first input signal, the first selection circuit receives twice as many signals as the number of the first input signals, rearranges them in descending order, and selects all even-numbered signals out of the rearranged signals to output the selected signals, and the terminal outputs the first signal of the latter half of the respective outputs of the first selection circuit as a result of the majority voting.

8. The majority circuit according to the claim 2, wherein the first sort circuit further receives the same number of second input signals having a second weight of half the first weight as that of the first input signal as the input signals, the majority circuit, further comprises a selector that selects which of the first input signals and the second input signals the first sort circuit receives, and the first selection circuit further selects all even-numbered signals or all odd-numbered signals to be obtained by rearranging the second input signals to output as recursive inputs to the first selection circuit.

9. The majority circuit according to the claim 1, wherein the first sort circuit is configured to receive and rearrange the first input signals having the first weight of a power of 2, and the first selection circuit is configured to output a signal having a weight twice the first weight.

10. The majority circuit according to the claim 1, further comprising:

a circuit that receives a plurality of signals whose sum of signal values is 0 as an initial input signal.

* * * * *